(12) United States Patent
Teng et al.

(10) Patent No.: US 8,461,797 B2
(45) Date of Patent: Jun. 11, 2013

(54) CURRENT DIRECTION DETECTION MODULE

(75) Inventors: Jen-Hao Teng, Kaohsiung (TW); Shang-Wen Luan, Kaohsiung (TW); Chao-Shun Chen, Kaohsiung (TW)

(73) Assignee: I-Shou University, Dashu Township, Kaohsiung County (TW)

( * ) Notice: Subject to any disclaimer, the term of this patent is extended or adjusted under 35 U.S.C. 154(b) by 351 days.

(21) Appl. No.: 13/016,817

(22) Filed: Jan. 28, 2011

(65) Prior Publication Data
US 2012/0195083 A1    Aug. 2, 2012

(51) Int. Cl.
*H02P 5/34*    (2012.01)

(52) U.S. Cl.
USPC ............................. 318/801; 363/37; 361/103

(58) Field of Classification Search
USPC ................... 363/16–17, 21.01, 21.06, 37, 54, 363/68, 81, 89, 95, 127, 63; 361/9, 10, 18, 361/23, 42, 45, 93.01, 102, 115, 117, 145, 361/103; 318/801, 807, 727, 496
See application file for complete search history.

(56) References Cited

U.S. PATENT DOCUMENTS

| | | | | |
|---|---|---|---|---|
| 4,468,603 A | * | 8/1984 | Vander Meer et al. | 318/779 |
| 4,493,015 A | * | 1/1985 | Ramlohr et al. | 363/63 |
| 5,077,629 A | * | 12/1991 | Ishii et al. | 361/94 |
| 5,559,684 A | * | 9/1996 | Ohms et al. | 363/25 |
| 5,777,864 A | * | 7/1998 | Seong et al. | 363/98 |
| 6,496,391 B1 | * | 12/2002 | Ikeda et al. | 363/53 |

FOREIGN PATENT DOCUMENTS

| | | |
|---|---|---|
| TW | 475991 | 2/2002 |
| TW | 589651 | 6/2004 |
| TW | M321170 | 10/2007 |
| TW | 200837368 | 9/2008 |
| TW | 200933176 | 8/2009 |
| TW | M379069 | 4/2010 |

* cited by examiner

*Primary Examiner* — Rajnikant Patel
(74) *Attorney, Agent, or Firm* — Muncy, Geissler, Olds & Lowe, PLLC

(57) ABSTRACT

The invention discloses a current direction detection module including a conversion unit, a bridge unit and an operation unit. The conversion unit has primary and secondary sides, wherein the secondary side has first and second ends. The bridge unit has first, second, third and fourth rectifying elements and first, second, third and fourth nodes. Each rectifying element has an anode and a cathode. The anode of the first rectifying element is coupled to the fourth rectifying element. The anode of the second rectifying element is coupled to the first rectifying element. The anode of the third rectifying element is coupled to the second rectifying element. The anode of the fourth rectifying element is coupled to the third rectifying element. The first and second nodes are coupled to the first and second ends. The operation unit amplifies two bridge voltages at the third and fourth nodes and outputs an operation voltage.

14 Claims, 8 Drawing Sheets

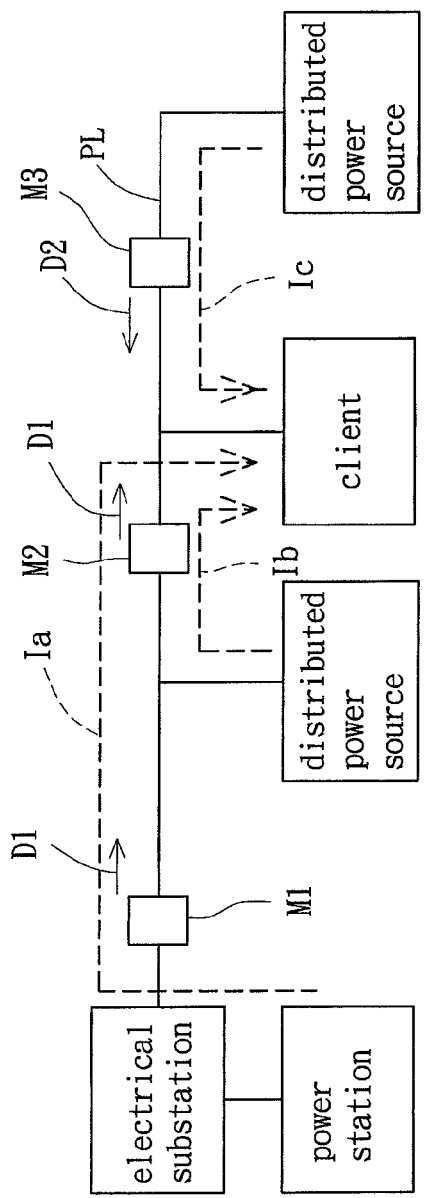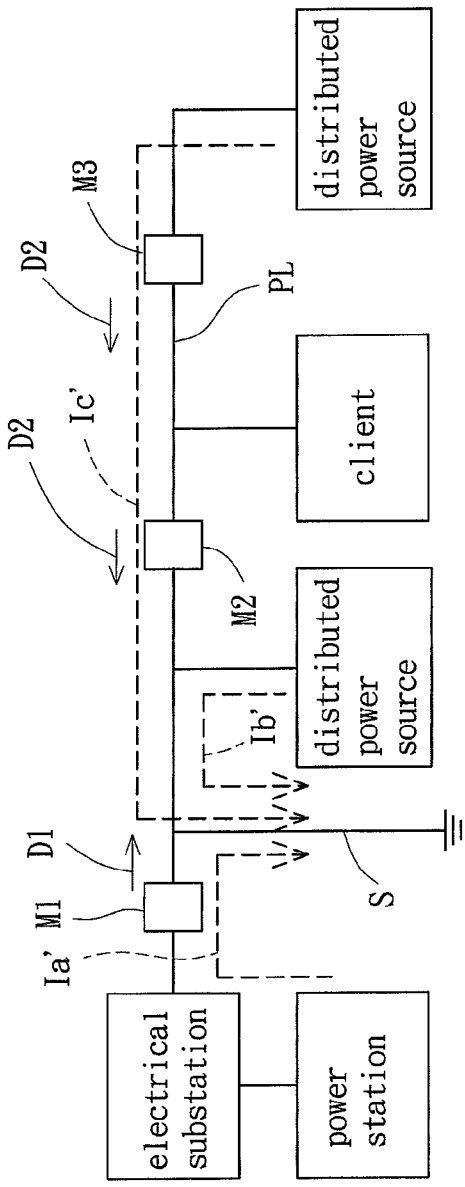
FIG. 1
FIG. 2

CURRENT DIRECTION DETECTION MODULE

BACKGROUND OF THE INVENTION

1. Field of the Invention

The present invention generally relates to a current direction detection module and, more particularly, to a current direction detection module that detects directions of faulty currents in an electric power system.

2. Description of the Related Art

Power distribution networks of an electric power system are widely arranged all over a country for industry development. The electric power systems should be maintained in an efficient way to provide better service quality during the operation thereof. Thus, when an abnormality occurs in the electric power system, it is required to quickly find out the location of the problem and the root cause thereof. In light of this, human labors are conventionally used to repair the electric power system. However, this may not be an efficient way anymore as the modern electric power systems are arranged on a very wide range.

To solve the problem, many detection apparatuses have been developed to collect faulty information of an electric power system for centralized management. For instance, Taiwanese Publication Number 200837368 discloses a multi-ended fault location system, Taiwanese Publication Number 200933176 discloses a fault detection method of an electric power network and a system thereof, Taiwanese Patent Number 589651 discloses a protection relay, Taiwanese Patent Number 475991 discloses a fault point location system, Taiwanese Patent Number M379069 discloses a fault location device, and Taiwanese Patent Number M321170 discloses an automatic detection device for detecting faults of branched feed lines of a power distribution system. However, these conventional detection devices can only detect the occurrence of faulty currents in the electric power system rather than the directions of the faulty currents. As a result, the location of the problem can only be located by proceeding in a step-by-step manner starting from an area of the electric power system adjacent to the conventional detection devices. In a preferred case, if the directions of the faulty currents can be recognized, the problem will be quickly located.

Furthermore, another conventional detection device detects directions of faulty currents via a directional over current relay. Specifically, the conventional detection device detects the directions of the faulty currents by acquiring voltage and current phase information via at least a potential transformer and at least a current transformer. However, the potential transformer cannot be used on a single transmission path and it is required to detect phase voltages thereof (L and N phases). In addition, the potential transformer should have its primary side connected to circuits of the electric power system. Thus, usage of the potential transformer makes it more difficult to detect the directions of the faulty currents. Moreover, the method requires higher costs because both the potential transformer and current transformer are used.

Therefore, it is desired to improve the conventional detection devices.

SUMMARY OF THE INVENTION

It is therefore the primary objective of this invention to provide a current direction detection module without any potential transformer.

The invention discloses a current direction detection module including a conversion unit, a bridge unit and an operation unit. The conversion unit has a primary side and a secondary side, wherein the secondary side has a first end and a second end. The bridge unit has a first rectifying element, a second rectifying element, a third rectifying element, a fourth rectifying element, a first node, a second node, a third node and a fourth node. Each of the first, second, third and fourth rectifying elements has an anode and a cathode. The anode of the first rectifying element is electrically coupled to the cathode of the fourth rectifying element to form the first node. The anode of the second rectifying element is electrically coupled to the cathode of the first rectifying element to form the third node. The anode of the third rectifying element is electrically coupled to the cathode of the second rectifying element to form the second node. The anode of the fourth rectifying element is electrically coupled to the cathode of the third rectifying element to form the fourth node. The first and second nodes are electrically coupled to the first and second ends of the conversion unit, respectively. The operation unit is electrically coupled to the third and fourth nodes of the bridge unit, amplifies two bridge voltages at the third and fourth nodes in a differential manner and outputs an operation voltage.

BRIEF DESCRIPTION OF THE DRAWINGS

The present invention will become more fully understood from the detailed description given hereinafter and the accompanying drawings which are given by way of illustration only, and thus are not limitative of the present invention, and wherein:

FIG. 1 shows a normal operation diagram of an electric power system equipped with a current direction detection module of the invention.

FIG. 2 shows an abnormal operation diagram of the electric power system equipped with the current direction detection module of the invention.

Figure 3:
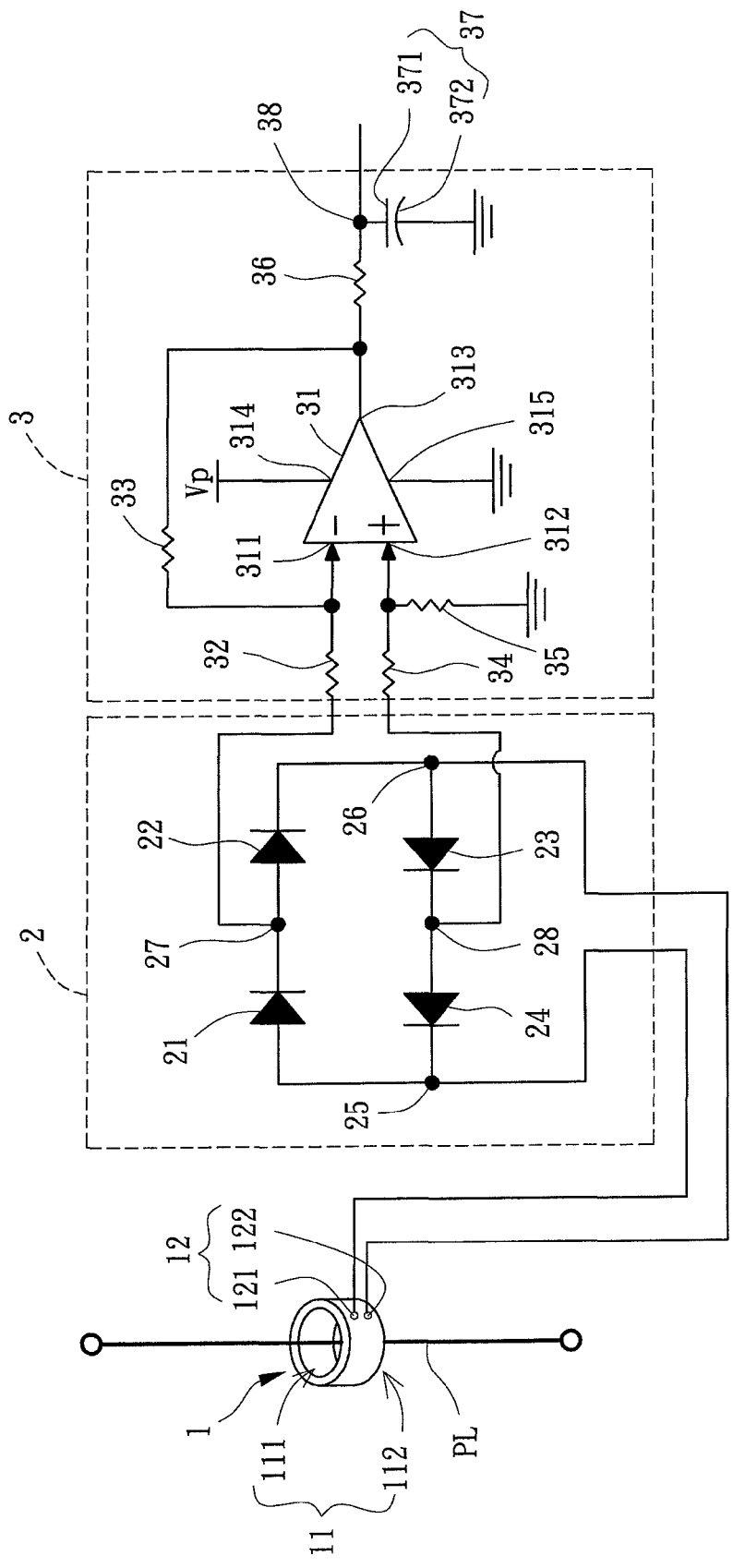
FIG. 3 shows a circuit diagram of the current direction detection module according to a first embodiment of the invention.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings and are utilized only to facilitate describing the invention.

DETAILED DESCRIPTION OF THE INVENTION

Referring to FIGS. 1 and 2, an operation diagram of an electric power system using a current direction detection module of the invention is shown according to a preferred embodiment of the invention. In FIG. 1, an electrical substation, a power station, a client and one or more distributed power sources are interconnected together via a plurality of power lines PL. The power lines PL carry currents passing in a first direction D1 and a second direction D2 opposite to the first direction D1. The power lines PL are equipped with one or more inspection modules (namely, M1, M2 and M3) for detecting the current direction of the electric power system when the electric power system is broken. Here, the current of the electric power system to be detected when the electric power system is broken is defined as a faulty current, which is used hereinafter for the entire specification. When the electric power system operates normally, a normal current Ia outputted by the power station flows to the client via the power lines PL. The distributed power sources also send normal currents Ib and Ic to the client via the power lines PL. The inspection modules M1 and M2 detect the currents of the electric power system flowing in the first direction D1, whereas the inspection module M3 detects the currents of the electric power system flowing in the second direction D2.

As shown in FIG. 2, faulty currents are shown to occur in the electric power system. When the electric power system is broken (for example, one power line PL is short to ground), a faulty current Ia' of the power station will be directed to the ground via a short circuit path S, and faulty currents Ib' and Ic' of the distributed power sources will also be directed to the ground via the short circuit path S. At this moment, the short circuit path S will have a short circuit current. Based on this, the inspection module M1 can detect that the faulty current Ia' flows in the first direction D1, and the inspection modules M2 and M3 can detect that the faulty currents Ib' and Ic' flow in the second direction D2. Therefore, based on the directions of the faulty currents detected by the inspection modules, the location of the short circuit can be determined.

Referring to FIG. 3, a circuit diagram of a current direction detection module is disclosed according to a first embodiment of the invention. The current direction detection module includes a conversion unit 1, a bridge unit 2 and an operation unit 3. The conversion unit 1 is electrically connected to the bridge unit 2 which, in turn, is electrically connected to the operation unit 3. The conversion unit 1 detects a to-be-detected current I1 (not shown) and outputs a converted current I2 (not shown). The bridge unit 2 receives the converted current I2 and outputs two bridge voltages V11 and V12 (not shown). The operation unit 3 receives the bridge voltages V11 and V12 and outputs an operation voltage V2. Based on this, the directions of faulty currents of the electric power system can be detected. In this embodiment, the to-be-detected current I1 is the current carried by the power lines PL.

The conversion unit 1 may be implemented by a current transformer, or by a device that converts an input current into an output current by a conversion ratio. The range of the conversion ratio may be determined in a way that a maximal value of the output current of the device does not exceed a maximal rated current of the bridge unit 2. Take the power distribution networks of the electric power system as an example: assuming that the standard value of a faulty current is 1000 A (Ampere) and the maximal rated current of the bridge unit 2 is 1 A, then a current transformer with a conversion ratio of 2000:1 can be used to obtain an output current of 0.5 A. The conversion unit 1 includes a primary side 11 and a secondary side 12. The primary side 11 can receive the to-be-detected current I1 via the power lines PL and output the conversed current I2 at the secondary side 12. The secondary side 12 has a first end 121 and a second end 122. Both the first end 121 and second end 122 are electrically connected to the bridge unit 2. In the embodiment, the conversion unit 1 is a current transformer with a conversion ratio of 2000:1. Based on this, the current transformer 1 is in a tube-like form having a K-end opening 111 and an L-end opening 112 at the primary side 11 thereof. In addition, the current transformer 1 has a K contact and an L contact, with the K contact serving as the first end 121 and the L contact serving as the second end 122. In the embodiment, when detecting the current direction of the power lines PL, the power lines PL must be extended through the primary side 11 of the current transformer 1. Based on this, the direction of currents of the power lines PL flowing from the K-end opening 111 to the L-end opening 112 is defined as the first direction D1, whereas the direction of currents of the power lines PL flowing from the L-end opening 112 to the K-end opening 111 is defined as the second direction D2.

The bridge unit 2 includes a first rectifying element 21, a second rectifying element 22, a third rectifying element 23, a fourth rectifying element 24, a first node 25, a second node 26, a third node 27 and a fourth node 28. The first rectifying element 21, second rectifying element 22, third rectifying element 23 and fourth rectifying element 24 may be solid state diodes, vacuum tube diodes or the like for rectification purposes. Each of the first rectifying element 21, second rectifying element 22, third rectifying element 23 and fourth rectifying element 24 has a cathode and an anode. The anode of the first rectifying element 21 is electrically connected to the cathode of the fourth rectifying element 24 to form the first node 25. The anode of the second rectifying element 22 is electrically connected to the cathode of the first rectifying element 21 to form the third node 27. The anode of the third rectifying element 23 is electrically connected to the cathode of the second rectifying element 22 to form the second node 26. The anode of the fourth rectifying element 24 is electrically connected to the cathode of the third rectifying element 23 to form the fourth node 28. The first node 25 and second node 26 are respectively electrically connected to the first end 121 and second end 122 of the conversion unit 1 for receiving the conversed current I2. The first rectifying element 21 and second rectifying element 22 cut off the negative cycle of the converted current I2, whereas the third rectifying element 23 and fourth rectifying element 24 cut off the positive cycle of the converted current I2. The third node 27 and fourth node 28 are electrically connected to the operation unit 3 for respectively outputting the two bridge voltages V11 and V12 thereto. In this embodiment, the first rectifying element 21, second rectifying element 22, third rectifying element 23 and fourth rectifying element 24 are implemented as solid state diodes with a maximal rated current of 1 A.

The operation unit 3 includes a first amplifying element 31, a first resistor 32, a second resistor 33, a third resistor 34, a fourth resistor 35, a fifth resistor 36, a first capacitor 37 and a fifth node 38. The first amplifying element 31 is an operational amplifier and includes a first inverting input end 311, a first non-inverting input end 312, a first output end 313, a first positive power supply end 314 and a first negative power supply end 315. The first inverting input end 311 is electrically connected to the first resistor 32 and second resistor 33. The first non-inverting input end 312 is electrically connected to the third resistor 34 and fourth resistor 35. The first output end 313 is electrically connected to the second resistor 33 and the fifth resistor 36. The first positive power supply end 314 is electrically connected to a positive power supply Vp, whereas the first negative power supply end 315 is connected to the ground. The first resistor 32 has one end electrically connected to the first inverting input end 311 of the first amplifying element 31 and the other end electrically connected to the third node 27 of the bridge unit 2 for receiving the bridge voltage V11. The second resistor 33 has two ends electrically connected to the first inverting input end 311 and the first output end 313, respectively, allowing the first amplifying element 31 to form a negative feedback amplifying circuit. The third resistor 34 has one end electrically connected to the first non-inverting input end 312 of the first amplifying element 31 and the other end electrically connected to the fourth node 28 of the bridge unit 2 for receiving the bridge voltage V12. The fourth resistor 35 has two ends electrically connected to the first non-inverting input end 312 and the ground, respectively. The first resistor 32, second resistor 33, third resistor 34 and fourth resistor 35 determine the gain Av1 of the first amplifying element 31. The fifth resistor 36 has one end electrically connected to the first output end 313 and the other end electrically connected to the first capacitor 37. The first capacitor 37 may be a polar or non-polar capacitor and includes a first end 371 and a second end 372. The first end 371 of the first capacitor 37 is electrically connected to the fifth resistor 36 to form the fifth node 38, whereas the second end 372 of the first capacitor 37 is connected to the ground. The first capacitor 37 and the fifth resistor 36 form a RC filtering circuit which filters high frequency noise of the first output end 313. Based on this, the operation unit 3 amplifies the bridge voltages V11 and V12 in a differential manner and outputs the operation voltage V2 at the fifth node 38 thereof. Meanwhile, in order to protect the current direction detection module from being damaged by the positive power supply Vp when the positive power supply Vp appears to be unstable, an additional capacitor may be connected between the first positive power supply end 314 and the ground to provide a bypass path. In this embodiment, the first amplifying element 31 is an operational amplifier having the gain Av1 with a value of 300, the resistance of the first resistor 32 and the third resistor 34 is 1KΩ, the resistance of the second resistor 33 and the fourth resistor 35 is 300KΩ, the positive power supply Vp is 3.3V (Volt) and the first capacitor 37 is a polar capacitor with a capacitance of 10 μF (micro Farad), with the first end 371 being positive polarity and the second end 372 being negative polarity.

The operation of the current direction detection module of the first embodiment is now elaborated in detail. Assume that the to-be-detected current I1 flows in the first direction D1, and the conversion unit 1 receives the to-be-detected current I1 at the primary side 11 and outputs the converted current I2 at the secondary side 12. In this case, the converted current I2 is a sinusoidal signal with noise. Therefore, the first rectifying element 21 and the second rectifying element 22 will allow the positive cycle of the converted current I2 to pass and cut off the negative cycle of the converted current I2. Thus, the third node 27 of the bridge unit 2 will have the bridge voltage V11 without negative cycle, which is then delivered to the first inverting input end 311 of the first amplifying element 31 after being attenuated by the first resistor 32. On the other hand, the third rectifying element 23 and the fourth rectifying element 24 will allow the negative cycle of the converted current I2 to pass and cut off the positive cycle of the converted current I2. Thus, the fourth node 28 of the bridge unit 2 will have the bridge voltage V12 without positive cycle, which is then delivered to the first non-inverting input end 312 of the first amplifying element 31 after being attenuated by the third resistor 34. The first resistor 32 sends the signal at the first output end 313 of the first amplifying element 31 back to the first inverting input end 311 in a negative feedback manner. The first output end 313 has a low-level signal with noise, which is then filtered by the RC filtering circuit consisting of the fifth resistor 36 and first capacitor 37. The voltage at the fifth node 38 is retrieved as the operation voltage V2 which is in a low level. The related experimental data is shown in Table 1 below:

TABLE 1

| Sequence number | The to-be-detected current I1 | The converted current I2 | The operation voltage V2 |
|---|---|---|---|
| 1 | 169 A | 84.5 mA | 84 mV |
| 2 | 536 A | 268 mA | 68 mV |
| 3 | 1068 A | 534 mA | 125 mV |
| 4 | 1184 A | 592 mA | 216 mV |
| 5 | 1800 A | 900 mA | 481 mV |

On the contrary, if the to-be-detected current I1 flows in the second direction D2, the third node 27 of the bridge unit 2 will have the bridge voltage V11 without positive cycle, as the first rectifying element 21 and the second rectifying element 22 allow the negative cycle of the converted current I2 to pass and cut off the positive cycle of the converted current I2. The bridge voltage V11 without positive cycle at the third node 27 of the bridge unit 2 will then be delivered to the first inverting input end 311 of the first amplifying element 31. On the other hand, the fourth node 28 of the bridge unit 2 will have the bridge voltage V12 without negative cycle, as the third rectifying element 23 and the fourth rectifying element 24 allow the positive cycle of the converted current I2 to pass and cut off the negative cycle of the converted current I2. The bridge voltage V12 without negative cycle at the fourth node 28 of the bridge unit 2 will then be delivered to the first non-inverting input end 312 of the first amplifying element 31. The first output end 313 has a high-level signal with noise, which is then filtered by the RC filtering circuit constituted by the fifth resistor 36 and first capacitor 37. The operation voltage V2 is in a high level. The related experimental data is shown in Table 2 below:

TABLE 2

| Sequence number | The to-be-detected current I1 | The converted current I2 | The operation voltage V2 |
|---|---|---|---|
| 1 | 169 A | 84.5 mA | 309 mV |
| 2 | 536 A | 268 mA | 435 mV |
| 3 | 1068 A | 534 mA | 420 mV |
| 4 | 1184 A | 592 mA | 586 mV |
| 5 | 1800 A | 900 mA | 827 mV |

Based on this, by retrieving the operation voltage V2 and setting a high-level threshold Vth and a low-level threshold Vt1, the operation voltage V2 is set to high level when the operation voltage V2 is higher than the high-level threshold Vth. As such, it may be determined that the to-be-detected current I1 flows in the second direction D2. On the other hand, the operation voltage V2 is set to low level when the operation voltage V2 is lower than the low-level threshold Vt1. As such, the to-be-detected current I1 may be determined to flow in the first direction D1. In addition, the operation voltage V2 may be magnified to enlarge the difference between the low and high levels for reducing determination error rate and required numerical accuracy of the high-level threshold Vth and low-level threshold Vt1.

Figure 4:
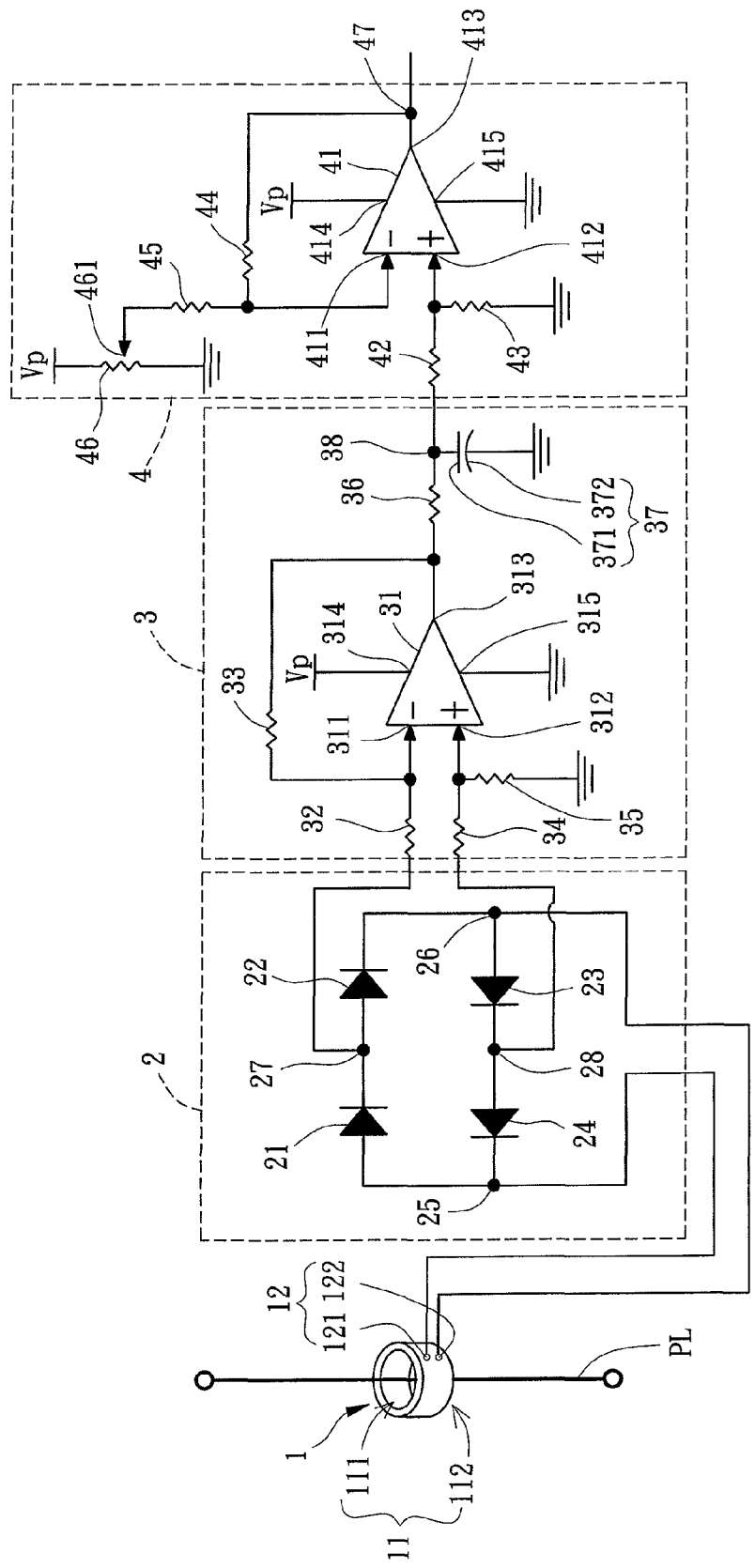
FIG. 4 shows a circuit diagram of the current direction detection module according to a second embodiment of the invention.

Referring to FIG. 4, a circuit diagram of a current direction detection module is disclosed according to a second embodiment of the invention. In comparison with the first embodiment, the current direction detection module in this embodiment includes a magnifying unit 4 electrically connected to the operation unit 3. The magnifying unit 4 magnifies the operation voltage V2 and outputs a magnifying voltage V3. The magnifying unit 4 includes a second amplifying element 41, a sixth resistor 42, a seventh resistor 43, a eighth resistor 44, a ninth resistor 45, a tenth resistor 46 and a sixth node 47. The second amplifying element 41 includes a second inverting input end 411, a second non-inverting input end 412, a second output end 413, a second positive power supply end 414 and a second negative power supply end 415. The second inverting input end 411 is electrically connected to the eighth resistor 44 and the ninth resistor 45. The second non-inverting input end 412 is electrically connected to the sixth resistor 42 and seventh resistor 43. The second output end 413 is electrically connected to the eighth resistor 44 to form the sixth node 47. The second positive power supply end 414 is electrically connected to the positive power supply Vp. The second negative power supply end 415 is connected to the ground. The sixth resistor 42 has one end electrically connected to the second non-inverting input end 412 of the second amplifying element 41 and the other end electrically connected to the fifth node 38 of the operation unit 3. The seventh resistor 43 has one end electrically connected to the second non-inverting input end 412 of the second amplifying element 41 and the other end electrically connected to the ground. The eighth resistor 44 has one end electrically connected to the second inverting input end 411 and the other end electrically connected to the second output end 413, so that the second amplifying element 41 is allowed to form an amplifying circuit. The ninth resistor 45 has one end electrically connected to the second inverting input end 411 and the other end electrically connected to the tenth resistor 46. The sixth resistor 42, seventh resistor 43, eighth resistor 44 and ninth resistor 45 determine the gain Av2 of the second amplifying element 41. The tenth resistor 46 has a first reference end 461 and two ends. The first reference end 461 is electrically connected to the ninth resistor 45 for adjusting the input voltage at the second inverting input end 411. The two ends of the tenth resistor 46 are electrically connected to the positive power supply Vp and the ground. Meanwhile, in order to prevent the current direction detection module from being damaged by the positive power supply Vp when the positive power supply Vp appears to be unstable, an additional capacitor may be connected between the second positive power supply end 414 and the ground to provide a bypass path. In addition, another capacitor may be connected between the first reference end 461 and the ground to provide another bypass path. In the embodiment, the second amplifying element 41 is an operational amplifier, the resistance of the sixth resistor 42 and the ninth resistor 45 is 1KΩ, the resistance of the seventh resistor 43 and the eighth resistor 44 is 8.2KΩ, the tenth resistor 46 is a variable resistor with a resistance of 5KΩ, and the second amplifying element 41 has a gain Av2 with a value of 8.2.

The operation of the current direction detection module of the second embodiment is now elaborated in detail. The various parameters mentioned above are designated with specific values for experiment (with the to-be-detected current I1 assumed to flow in the first direction D1), as shown below: the first positive power supply end 314 and the second positive power supply end 414 are electrically connected to the positive power supply Vp of 3.3V, the first negative power supply end 315 and second negative power supply end 415 are connected to the ground, the gain value Av1 of the first amplifying element 31 is 300, the gain value Av2 of the second amplifying element 41 is 8.2, and the first reference end 461 of the tenth resistor 46 outputs a first reference voltage Vref1 which is set as 191 mV. Referring to FIG. 4, the operation voltage V2 at the fifth node 38 is delivered to the magnifying unit 4. Assuming that the voltage at the sixth node 47 is retrieved as the magnifying voltage V3, the magnifying voltage V3 will have the following relation with the operation voltage V2, as indicated in formula (I) below:

$$V3=(V2-Vref1)*Av2 \qquad (1)$$

In the embodiment, since the second positive power supply end 414 and the second negative power supply end 415 of the second amplifying element 41 are respectively electrically connected to the positive power supply Vp and the ground, the resulted value of the V2 minus the Vref1 will be negative. The negative resulted value will not be amplified at the sixth node 47 of the second amplifying element 41 (i.e. the magnifying voltage V3 is almost 0V at the sixth node 47) since the second amplifying element 41 is not connected to any negative power supply. Therefore, based on the assumption that the operation voltage V2 flows in the first direction D1, the operation voltage V2 will be smaller than the first reference voltage Vref1. As such, the magnifying voltage V3, which is almost 0 V, will be closer to 0 V than the operation voltage V2 is. The experimental data regarding the magnifying voltage V3 and the operation voltage V2 is shown in Table 3 below:

TABLE 3

| Sequence number | The to-be-detected current I1 | The converted current I2 | The operation voltage V2 | The magnifying voltage V3 |
|---|---|---|---|---|
| 1 | 169 A | 84.5 mA | 84 mV | 51 mV |
| 2 | 536 A | 268 mA | 68 mV | 58 mV |
| 3 | 1068 A | 534 mA | 125 mV | 77 mV |
| 4 | 1184 A | 592 mA | 216 mV | 204 mV |
| 5 | 1800 A | 900 mA | 481 mV | 1.91 V |

On the contrary, if the to-be-detected current I1 flows in the second direction D2, the voltage at the fifth node 38 is in high level. As a result, the magnifying voltage V3 will be closer to the positive power supply Vp than the operation voltage V2 is. The experimental data regarding the magnifying voltage V3 and the operation voltage V2 is shown in Table 4 below:

TABLE 4

| Sequence number | The to-be-detected current I1 | The converted current I2 | The operation voltage V2 | The magnifying voltage V3 |
|---|---|---|---|---|
| 1 | 169 A | 84.5 mA | 309 mV | 850 mV |
| 2 | 536 A | 268 mA | 435 mV | 1.78 V |
| 3 | 1068 A | 534 mA | 420 mV | 1.85 V |
| 4 | 1184 A | 592 mA | 586 mV | 2.12 V |
| 5 | 1800 A | 900 mA | 827 mV | 2.17 V |

Based on this, by retrieving the magnifying voltage V3 and setting the high-level threshold Vth and low-level threshold Vt1, it can be determined that the magnifying voltage V3 is in the high or low level. The magnifying voltage V3 is set to high level when the magnifying voltage V3 is higher than the high-level threshold Vth. At this point, the to-be-detected current I1 may be determined to flow in the second direction D2. On the contrary, the magnifying voltage V3 is set to low level when the magnifying voltage V3 is lower than the low-level threshold Vt1. At this point, the to-be-detected current I1 may be determined to flow in the first direction D1. Moreover, the magnifying voltage V3 may be input to a waveform shaping circuit so that the high-level threshold Vth and low-level threshold Vt1 of the magnifying voltage V3 may be replaced by and fixed at another two DC voltage levels. In this manner, the output signal of the current direction detection module of the invention may be in the form of a logic signal reflecting the directions of faulty currents of the electric power system.

Figure 5:
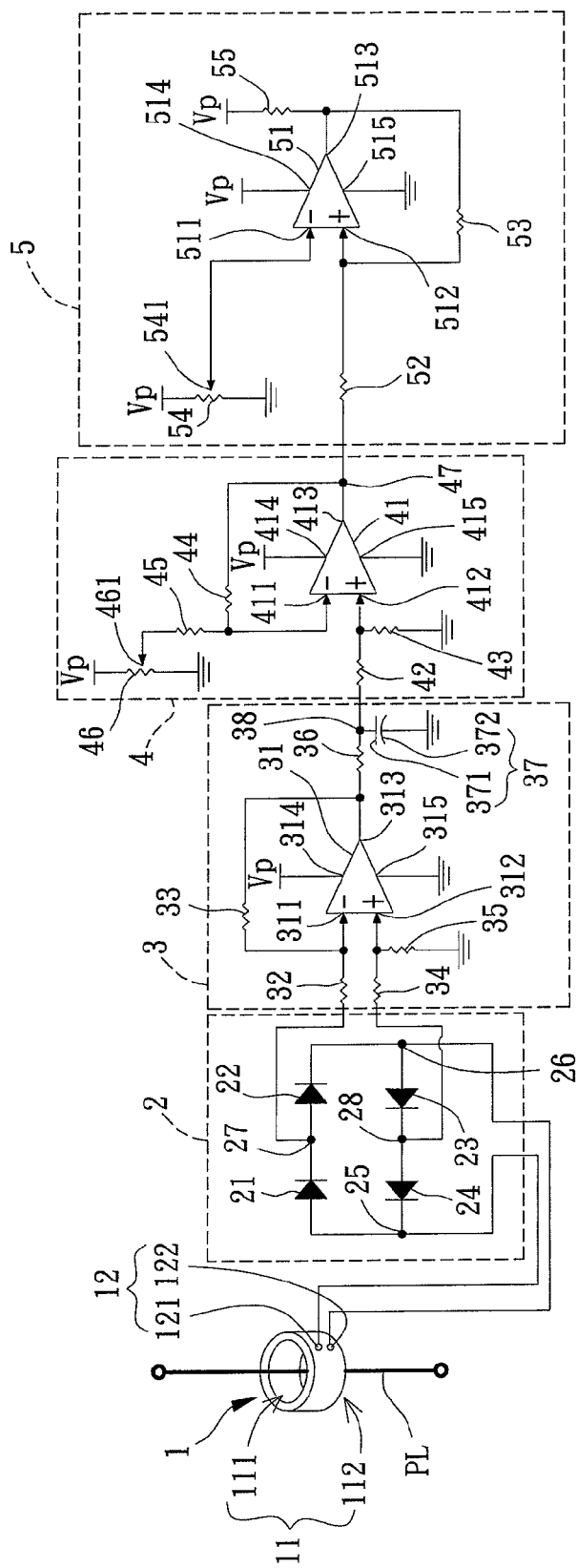
FIG. 5 shows a circuit diagram of the current direction detection module according to a third embodiment of the invention.

Referring to FIG. 5, a circuit diagram of the current direction detection module is disclosed according to a third embodiment of the invention. In comparison with the second embodiment, the current direction detection module in this embodiment further includes a shaping unit 5 electrically connected to the magnifying unit 4 for shaping the magnifying voltage V3 into a shaping voltage V4. The shaping voltage V4 is a logic signal. In the embodiment, the shaping unit 5 is a Schmitt trigger, which includes a third amplifying element 51, an eleventh resistor 52, a twelfth resistor 53, a thirteenth resistor 54 and a fourteenth resistor 55. The third amplifying element 51 includes a third inverting input end 511, a third non-inverting input end 512, a third output end 513, a third positive power supply end 514 and a third negative power supply end 515. The third inverting input end 511 is electrically connected to the thirteenth resistor 54. The third non-inverting input end 512 is electrically connected to the eleventh resistor 52 and twelfth resistor 53. The third output end 513 is electrically connected to the twelfth resistor 53 and fourteenth resistor 55. The third positive power supply end 514 is electrically connected to the positive power supply Vp and the third negative power supply end 515 is connected to the ground. The eleventh resistor 52 has one end electrically connected to the third non-inverting input end 512 and the other end electrically connected to the sixth node 47 of the magnifying unit 4. The twelfth resistor 53 has one end electrically connected to the third non-inverting input end 512 and the other end electrically connected to the third output end 513. The thirteenth resistor 54 has a second reference end 541 and two ends. The second reference end 541 is electrically connected to the third inverting input end 511. The two ends of the thirteenth resistor 54 are electrically connected to the positive power supply Vp and the ground. The fourteenth resistor 55 has one end electrically connected to the positive power supply Vp and the other end electrically connected to the third output end 513. Meanwhile, in order to prevent the current direction detection module from being damaged by the positive power supply Vp when the positive power supply Vp appears to be unstable, an additional capacitor may be connected between the third positive power supply end 514 and the ground to provide a bypass path. In addition, another capacitor may be connected between the second reference end 541 and the ground to provide another bypass path. In the embodiment, the third amplifying element 51 is an operational amplifier, the resistance of the eleventh resistor 52 is 75.2KΩ, the resistance of the twelfth resistor 53 is 825KΩ, the thirteenth resistor 54 is a variable resistor with a resistance of 5KΩ, and the resistance of the fourteenth resistor 55 is 1KΩ.

The operation of the current direction detection module of the third embodiment is now elaborated in detail. Based on the parameters given in previous embodiments that the gain value Av1 of the first amplifying element 31 is 300, the gain value Av2 of the second amplifying element 41 is 8.2, the first reference voltage Vref1 is 191 mV, and the shaping unit 5 is a Schmitt trigger, the shaping voltage V4 at the third output end 513 will be in a high level of the logic signal when the magnifying voltage V3 is higher than the high-level threshold Vth. On the contrary, the shaping voltage V4 will be in a low level of the logic signal when the magnifying voltage V3 is lower than the low-level threshold Vt1. Meanwhile, the second reference end 541 of the thirteenth resistor 54 outputs a second reference voltage Vref2 to the third inverting input end 511 of the third amplifying element 51. The second reference voltage Vref2 can adjust the high-level threshold Vth. The shaping voltage V4 turns into the high level from the low level of the logic signal when the magnifying voltage V3 is higher than the high-level threshold Vth, whereas the shaping voltage V4 turns into the low level from the high level of the logic signal when the magnifying voltage V3 is lower than the low-level threshold Vt1. In the embodiment, the high-level threshold Vth is 0.8V, the low-level threshold Vt1 is 0.45V, the high level of the logic signal is 3.3 V and the low level of the logic signal is 0.8 V. Experimental data regarding the to-be-detected current I1 flowing in the first direction D1 is shown in Table 5 below:

TABLE 5

| Sequence number | The to-be-detected current I1 | The converted current I2 | The operation voltage V2 | The magnifying voltage V3 | The shaping voltage V4 |
|---|---|---|---|---|---|
| 1 | 169 A | 84.5 mA | 84 mV | 51 mV | 0.8 V |
| 2 | 536 A | 268 mA | 68 mV | 58 mV | 0.8 V |
| 3 | 1068 A | 534 mA | 125 mV | 77 mV | 0.8 V |
| 4 | 1184 A | 592 mA | 216 mV | 204 mV | 0.8 V |
| 5 | 1800 A | 900 mA | 481 mV | 1.91 V | 3.3 V |

In the Table 5 above, it can be known from the data 1 to 4 that the shaping voltage V4 is always 0.8 V when the to-be-detected current I1 flows in the first direction D1. Furthermore, from the data 5 in the Table 5 above, the shaping voltage V4 is 3.3 V when the to-be-detected current I1 is over the range that can be measured. To limit the to-be-detected current I1 in a proper range, the first reference voltage Vref1 must be adjusted. For example, the first reference voltage Vref1 is set as 400 mV and the gain value Av2 of the second amplifying element 41 is set as 40. In this case, the shaping voltage V4 will become 0.8 V after adjustment.

On the contrary, experimental data regarding the to-be-detected current I1 flowing in the second direction D2 is shown in Table 6 below:

TABLE 6

| Sequence number | The to-be-detected current I1 | The converted current I2 | The operation voltage V2 | The magnifying voltage V3 | The shaping voltage V4 |
|---|---|---|---|---|---|
| 1 | 169 A | 84.5 mA | 309 mV | 850 mV | 3.3 V |
| 2 | 536 A | 268 mA | 435 mV | 1.78 V | 3.3 V |
| 3 | 1068 A | 534 mA | 420 mV | 1.85 V | 3.3 V |
| 4 | 1184 A | 592 mA | 586 mV | 2.12 V | 3.3 V |
| 5 | 1800 A | 900 mA | 827 mV | 2.17 V | 3.3 V |

Furthermore, the circuit of the current direction detection module of the third embodiment may be simplified by increasing the capacity of the first capacitor 37 of the operation unit 3 and replacing the shaping unit 5 with a comparator circuit electrically connected to the magnifying unit 4.

Figure 6:
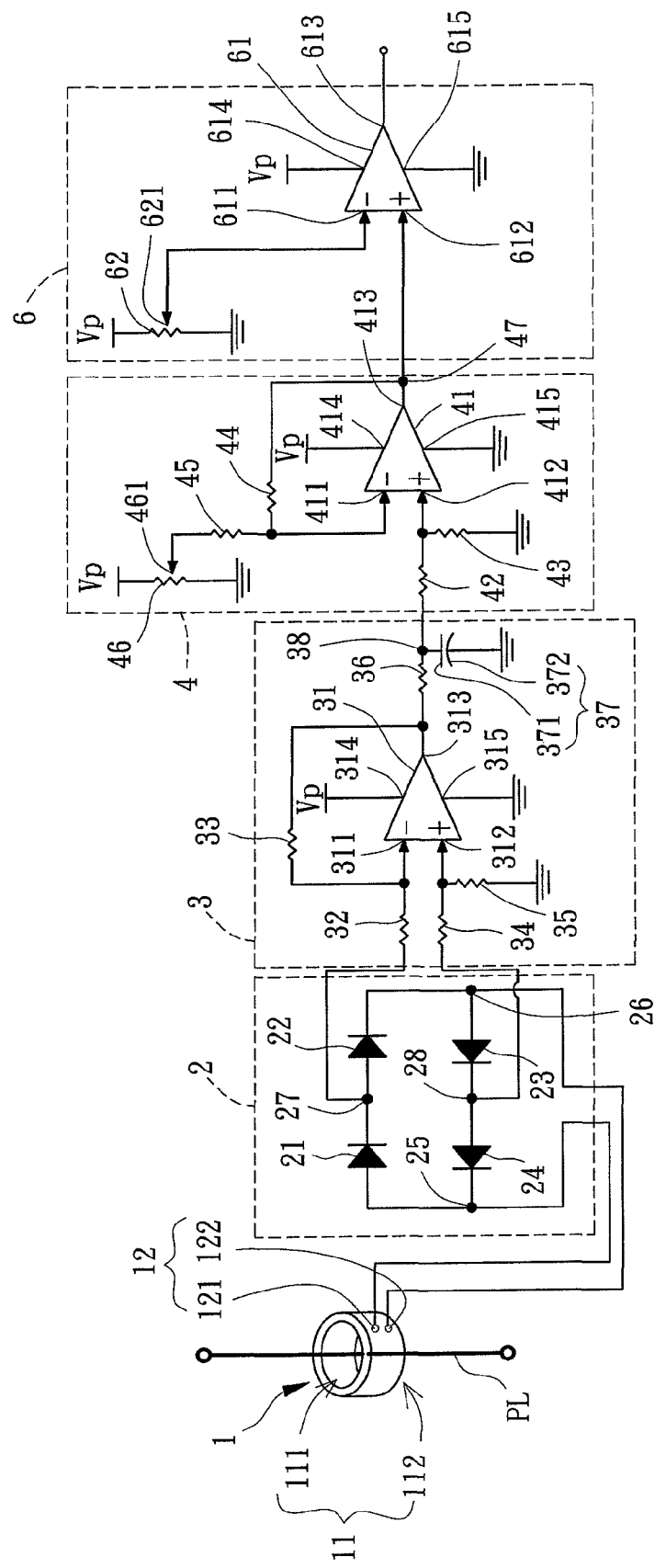
FIG. 6 shows a circuit diagram of the current direction detection module according to a fourth embodiment of the invention.

Referring to FIG. 6, a circuit diagram of the current direction detection module is disclosed according to a fourth embodiment of the invention. In comparison with the third embodiment, the current direction detection module in the embodiment further replaces the shaping unit 5 with a comparing unit 6 and changes the capacity of the first capacitor 37 of the operation unit 3 into 100 µF, with the comparing unit 6 electrically connected to the magnifying unit 4. Based on this, the comparing unit 6 receives the magnifying voltage V3 and outputs a comparing voltage V5, which is a logic signal. The comparing unit 6 includes a fourth amplifying element 61 and a fifteenth resistor 62. The fourth amplifying element 61 includes a fourth inverting input end 611, a fourth non-inverting input end 612, a fourth output end 613, a fourth positive power supply end 614 and a fourth negative power supply end 615. The fourth inverting input end 611 is electrically connected to the fifteenth resistor 62. The fourth non-inverting input end 612 is electrically connected to the sixth node 47 of the magnifying unit 4. The fourth positive power supply end 614 is electrically connected to the positive power supply Vp and the fourth negative power supply end 615 is connected to the ground. The fifteenth resistor 62 includes a third reference end 621 and two ends. The third reference end 621 is electrically connected to the fourth inverting input end 611. The two ends of the fifteenth resistor 62 are electrically connected to the positive power supply Vp and the ground. Meanwhile, in order to prevent the current direction detection module from being damaged by the positive power supply Vp when the positive power supply Vp appears to be unstable, an additional capacitor may be connected between the fourth positive power supply end 614 and the ground to provide a bypass path. In addition, another capacitor may be connected between the third reference end 621 and the ground to provide another bypass path. In the embodiment, the fourth amplifying element 61 is an operational amplifier and the fifteenth resistor 62 is a variable resistor with a resistance of 5KΩ.

The operation of the current direction detection module of the fourth embodiment is now elaborated in detail. Based on the given parameters that the gain value Av1 of the first amplifying element 31 is 300, the gain value Av2 of the second amplifying element 41 is 8.2, the first reference voltage Vref1 is 0 mV and the second reference voltage Vref2 is 48 mV, and assuming that the voltage at the fourth output end 613 is retrieved as the comparing voltage V5, experimental data regarding the to-be-detected current I1 flowing in the first direction D1 can be seen in Table 7 below:

TABLE 7

| Sequence number | The converted current I2 | The operation voltage V2 | The magnifying voltage V3 | The comparing voltage V5 |
|---|---|---|---|---|
| 1 | 58 mA | 5.83 mV | 7.64 mV | 0.02 V |
| 2 | 307 mA | 6.99 mV | 7.03 mV | 0.02 V |
| 3 | 576 mA | 6.6 mV | 7.82 mV | 0.02 V |

On the contrary, experimental data regarding the to-be-detected current I1 flowing in the second direction D2 is shown in Table 8 below:

TABLE 8

| Sequence number | The converted current I2 | The operation voltage V2 | The magnifying voltage V3 | The comparing voltage V5 |
|---|---|---|---|---|
| 1 | 58 mA | 53.5 mV | 399 mV | 2.13 V |
| 2 | 307 mA | 50.9 mV | 380 mV | 2.09 V |
| 3 | 576 mA | 55 mV | 363 mV | 2.15 V |

Figure 7A:
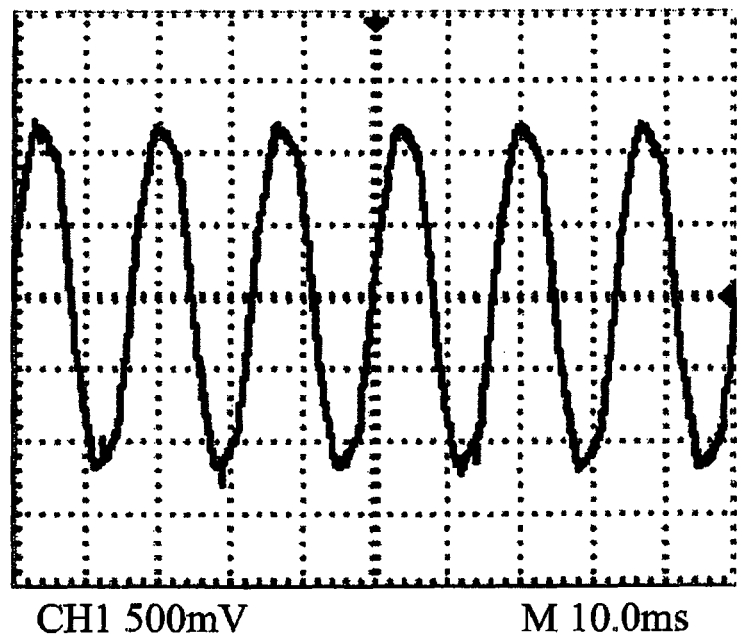
FIGS. 7a and 7b show voltage signals converted from a current signal using a current clamp at a secondary side of a conversion unit in the fourth embodiment of the invention.
Figure 7B:
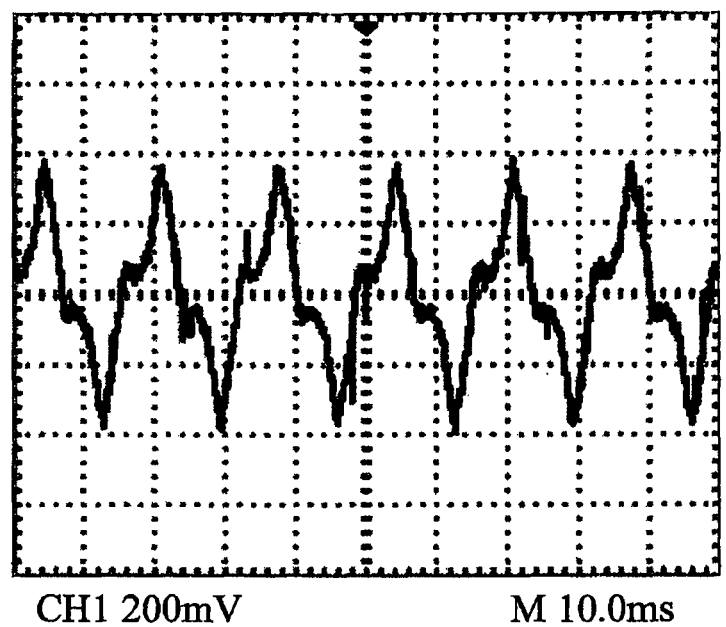
Figure 8A:
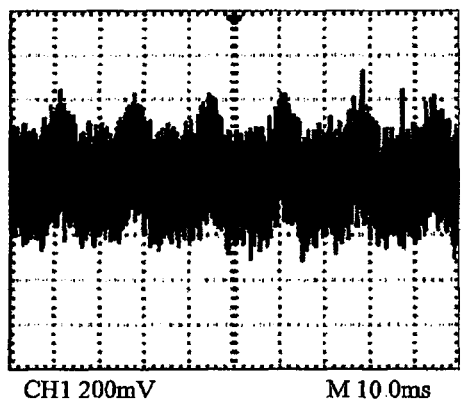
FIGS. 8a to 8f show waveforms measured at various measurement ends of the current direction detection module when a to-be-detected current flows in a first direction.
Figure 8D:
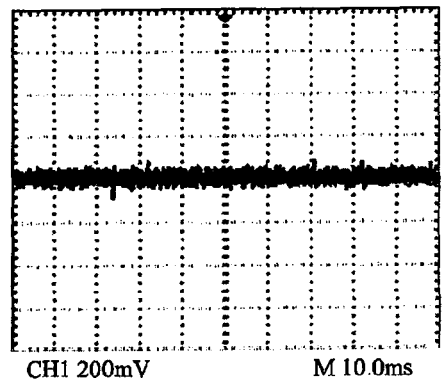
Figure 8B:
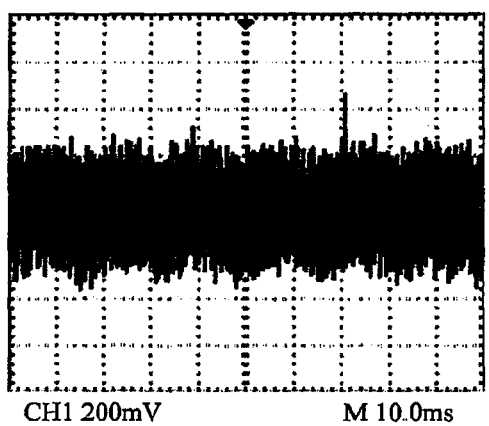
Figure 8E:
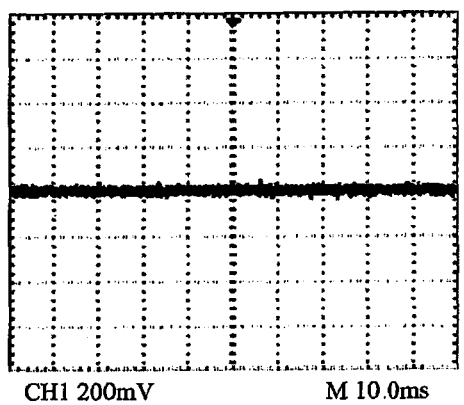
Figure 8C:
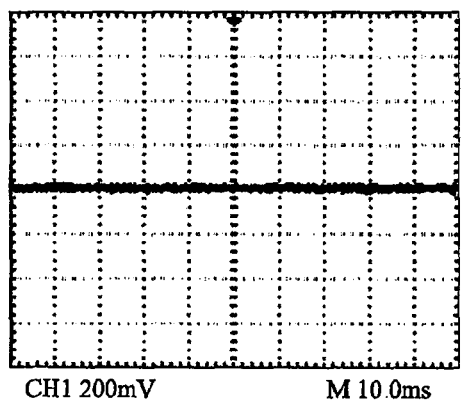
Figure 8F:
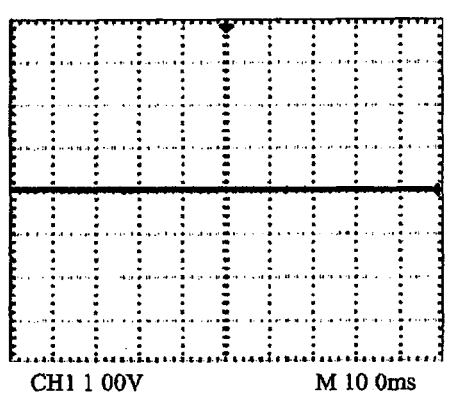

FIG. 7a shows a voltage signal converted from a current signal using a current clamp at the secondary side 12 of the conversion unit 1 when the first end 121 and the second end 122 are electrically connected to each other but not connected to the bridge unit 2. FIG. 7b shows a voltage signal converted from the current signal using the current clamp at the secondary side 12 of the conversion unit 1 when the first end 121 and the second end 122 are electrically connected to the bridge unit 2. FIGS. 8a to 8f show waveforms measured at various measurement ends of the current direction detection module when the to-be-detected current I1 flows in the first direction D1. Specifically, FIG. 8a shows a voltage signal of the first inverting input end 311 of the first amplifying element 31. FIG. 8b shows a voltage signal of the first non-inverting input end 312 of the first amplifying element 31. FIG. 8c shows a voltage signal of the first output end 313 of the first amplifying element 31, with noise included in the voltage signal. FIG. 8d shows a voltage signal of the fifth node 38 of the operation unit 3 (namely, the operation voltage V2), with the noise filtered off. FIG. 8e shows a voltage signal of the sixth node 47 of the operation unit 3 (namely, the amplified signal of the voltage signal shown in FIG. 8d). FIG. 8f shows a voltage signal of the fourth output end 613 of the fourth amplifying element 61 (namely, a logic signal having a stable DC value converted from the magnifying voltage V3).

Figure 9A:
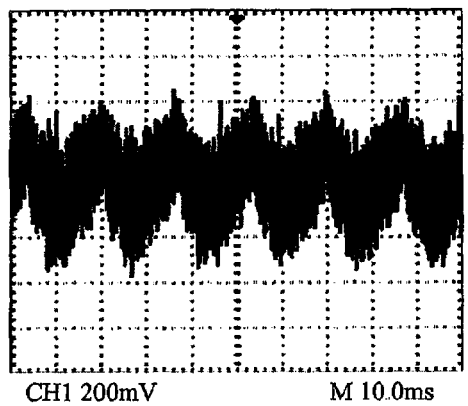
FIGS. 9a to 9f show waveforms measured at the various measurement ends of the current direction detection module when the to-be-detected current flows in a second direction opposite to the first direction.
Figure 9D:
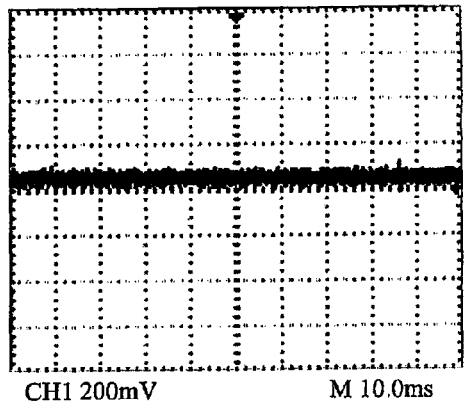
Figure 9B:
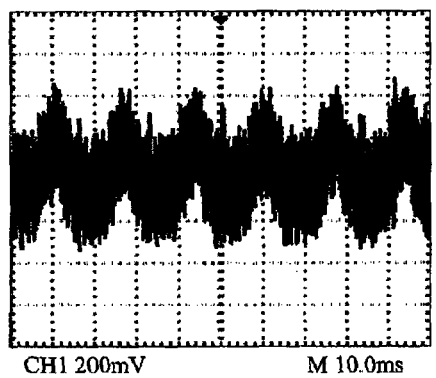
Figure 9E:
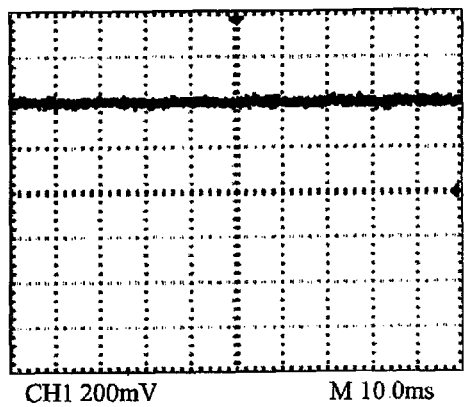
Figure 9C:
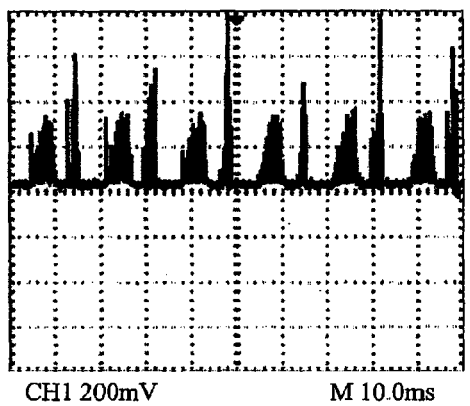
Figure 9F:
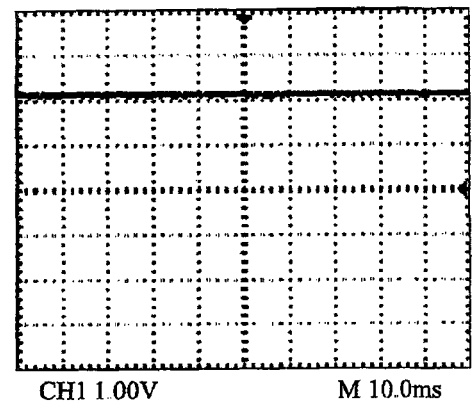

FIGS. 9a to 9f show waveforms measured at various measurement ends of the current direction detection module when the to-be-detected current I1 flows in the second direction D2. Specifically, FIG. 9a shows a voltage signal of the first inverting input end 311 of the first amplifying element 31. FIG. 9b shows a voltage signal of the first non-inverting input end 312 of the first amplifying element 31. FIG. 9c shows a voltage signal of the first output end 313 of the first amplifying element 31. FIG. 9d shows a voltage signal of the fifth node 38 of the operation unit 3 (namely, the operation voltage V2). FIG. 9e shows a voltage signal of the sixth node 47 of the operation unit 3 (namely, the magnifying voltage V3). FIG. 9f shows a voltage signal of the fourth output end 613 of the fourth amplifying element 61 (namely, the waveform of the comparing voltage V5).

The current direction detection module of the invention uses the conversion unit 1 to convert the to-be-detected current I1 into the converted current I2, which is then converted into the operation voltage V2 with different voltage levels by the bridge unit 2 and the operation unit 3. Based on this, the direction of the to-be-detected current I1 may be recognized by determining whether the operation voltage V2 is smaller than the low-level threshold Vt1 or higher than the high-level threshold Vth. Thus, when short circuit occurs in the electric power system, the current direction detection module of the invention may detect the directions of faulty currents caused by the short circuit in the electric power system, thereby quickly finding out the location of the short circuit by referring to the directions of the faulty currents.

Furthermore, since it is only required to extend the power lines PL through the primary side 11 of the conversion unit 1 without having to use the potential transformer, the current direction detection module of the invention may achieve reduced costs and easy detection of directions of faulty currents in the electric power system.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A current direction detection module, comprising:
a conversion unit having a primary side and a secondary side, wherein the secondary side has a first end and a second end;
a bridge unit having a first rectifying element, a second rectifying element, a third rectifying element, a fourth rectifying element, a first node, a second node, a third node and a fourth node, wherein each of the first, second, third and fourth rectifying elements has an anode and a cathode, the anode of the first rectifying element is electrically coupled to the cathode of the fourth rectifying element to form the first node, the anode of the second rectifying element is electrically coupled to the cathode of the first rectifying element to form the third node, the anode of the third rectifying element is electrically coupled to the cathode of the second rectifying element to form the second node, the anode of the fourth rectifying element is electrically coupled to the cathode of the third rectifying element to form the fourth node, and the first and second nodes are electrically coupled to the first and second ends of the conversion unit, respectively; and
an operation unit electrically coupled to the third and fourth nodes of the bridge unit, and amplifying two bridge voltages at the third and fourth nodes in a differential manner to output an operation voltage.

2. The current direction detection module as claimed in claim 1, wherein the operation unit includes a first amplifying element, a first resistor, a second resistor, a third resistor, a fourth resistor, a fifth resistor, a first capacitor and a fifth node, the first amplifying element has a first inverting input end, a first non-inverting input end, a first output end, a first positive power supply end and a first negative power supply end, the first inverting input end is electrically coupled to the first and second resistors, the first non-inverting input end is electrically coupled to the third and fourth resistors, the first output end is electrically coupled to the second and fifth resistors, the first resistor has two ends respectively electrically coupled to the first inverting input end and the third node of the bridge unit, the second resistor has two ends respectively electrically coupled to the first inverting input end and the first output end, the third resistor has two ends respectively electrically coupled to the first non-inverting input end of the first amplifying element and the fourth node of the bridge unit, the fifth resistor has two ends respectively electrically coupled to the first output end and the first capacitor, the first capacitor has a first end and a second end, and the first end of the first capacitor is electrically coupled to the fifth resistor to form the fifth node.

3. The current direction detection module as claimed in claim 2, further comprising a magnifying unit including a second amplifying element, a sixth resistor, a seventh resistor, an eighth resistor, a ninth resistor, a tenth resistor and a sixth node, wherein the second amplifying element includes a second inverting input end, a second non-inverting input end, a second output end, a second positive power supply end and a second negative power supply end, the second inverting input end is electrically coupled to the eighth and ninth resistors, the second non-inverting input end is electrically coupled to the sixth and seventh resistors, the second output end is electrically coupled to the eighth resistor to form the sixth node, the sixth resistor has two ends respectively electrically coupled to the second non-inverting input end of the second amplifying element and the fifth node of the operation unit, the eighth resistor has two ends respectively electrically coupled to the second inverting input end and the second output end, the ninth resistor has two ends respectively electrically coupled to the second inverting input end and the tenth resistor, the tenth resistor has a first reference end and two ends, and the first reference end is electrically coupled to the ninth resistor.

4. The current direction detection module as claimed in claim 3, further comprising a shaping unit including a third amplifying element, an eleventh resistor, a twelfth resistor, a thirteenth resistor and a fourteenth resistor, wherein the third amplifying element includes a third inverting input end, a third non-inverting input end, a third output end, a third positive power supply end and a third negative power supply end, the third inverting input end is electrically coupled to the thirteenth resistor, the third non-inverting input end is electrically coupled to the eleventh and twelfth resistors, the third output end is electrically coupled to the twelfth and fourteenth resistors, the eleventh resistor has two ends respectively electrically coupled to the third non-inverting input end and the sixth node of the magnifying unit, the twelfth resistor has two ends respectively electrically coupled to the third non-inverting input end and the third output end, the thirteenth resistor has a second reference end and two ends, and the second reference end is electrically coupled to the third inverting input end.

5. The current direction detection module as claimed in claim 3, further comprising a comparing unit including a fourth amplifying element and a fifteenth resistor, wherein the fourth amplifying element includes a fourth inverting input end, a fourth non-inverting input end, a fourth output end, a fourth positive power supply end and a fourth negative power supply end, the fourth inverting input end is electrically coupled to the fifteenth resistor, the fourth non-inverting input end is electrically coupled to the sixth node of the magnifying unit, the fifteenth resistor includes a third reference end and two ends, and the third reference end is electrically coupled to the fourth inverting input end.

6. The current direction detection module as claimed in claim 2, wherein the first positive power supply end is electrically coupled to a positive power supply, the first negative power supply end is electrically coupled to the ground, the fourth resistor has two ends respectively electrically coupled to the first non-inverting input end and the ground, and the second end of the first capacitor is electrically coupled to the ground.

7. The current direction detection module as claimed in claim 3, wherein the first positive power supply end is electrically coupled to a positive power supply, the first negative power supply end is electrically coupled to the ground, the fourth resistor has two ends respectively electrically coupled to the first non-inverting input end and the ground, and the second end of the first capacitor is electrically coupled to the ground, the second positive power supply end is electrically coupled to the positive power supply, the second negative power supply end is electrically coupled to the ground, the seventh resistor has two ends respectively electrically coupled to the second non-inverting input end and the ground, and the two ends of the tenth resistor are electrically coupled to the positive power supply and the ground, respectively.

8. The current direction detection module as claimed in claim 4, wherein the first positive power supply end is electrically coupled to a positive power supply, the first negative power supply end is electrically coupled to the ground, the fourth resistor has two ends respectively electrically coupled to the first non-inverting input end and the ground, and the second end of the first capacitor is electrically coupled to the ground, the second positive power supply end is electrically coupled to the positive power supply, the second negative power supply end is electrically coupled to the ground, the seventh resistor has two ends respectively electrically coupled to the second non-inverting input end and the ground, and the two ends of the tenth resistor are respectively electrically coupled to the positive power supply and the ground, the third positive power supply end is electrically coupled to the positive power supply, the third negative power supply end is electrically coupled to the ground, the two ends of the thirteenth resistor are respectively electrically coupled to the positive power supply and the ground, and the fourteenth resistor has two ends respectively electrically coupled to the positive power supply and the third output end.

9. The current direction detection module as claimed in claim 5, wherein the first positive power supply end is electrically coupled to a positive power supply, the first negative power supply end is electrically coupled to the ground, the fourth resistor has two ends respectively electrically coupled to the first non-inverting input end and the ground, and the second end of the first capacitor is electrically coupled to the ground, the second positive power supply end is electrically coupled to the positive power supply, the second negative power supply end is electrically coupled to the ground, the seventh resistor has two ends respectively electrically coupled to the second non-inverting input end and the ground, and the two ends of the tenth resistor are respectively electrically coupled to the positive power supply and the ground, the fourth positive power supply end is electrically coupled to the positive power supply, the fourth negative power supply end is electrically coupled to the ground, and the two ends of the fifteenth resistor are electrically coupled to the positive power supply Vp and the ground, respectively.

10. The current direction detection module as claimed in claim 1, wherein the conversion unit is a current transformer.

11. The current direction detection module as claimed in claim 1, wherein the first, second, third and fourth rectifying elements are solid state diodes.

12. The current direction detection module as claimed in claim 2, wherein the first amplifying element is an operational amplifier.

13. The current direction detection module as claimed in claim 2, wherein the capacity of the first capacitor is 10 μF.

14. The current direction detection module as claimed in claim 5, wherein the capacity of the first capacitor is 100 μF.

* * * * *